United States Patent [19]

Kawa et al.

[11] 4,293,998

[45] Oct. 13, 1981

[54] AUTOMATIC APPARATUS FOR INSERTING ELECTRIC COMPONENTS

[75] Inventors: Hidetoshi Kawa, Ibaraki; Kazuhiro Mori, Katano; Yoshihiko Misawa, Katano; Hiroshi Nakagawa, Katano, all of Japan

[73] Assignee: Matsushita Electric Industrial Co., Ltd., Kadoma, Japan

[21] Appl. No.: 71,378

[22] Filed: Aug. 30, 1979

[30] Foreign Application Priority Data

Aug. 31, 1978 [JP] Japan ............................ 53-107130

[51] Int. Cl.³ .......................................... H05K 13/04
[52] U.S. Cl. ................................... 29/564.1; 29/741; 29/835; 29/838
[58] Field of Search ................. 29/564.1, 741, 831, 29/832, 835, 837, 838

[56] References Cited

U.S. PATENT DOCUMENTS

| | | | |
|---|---|---|---|
| 3,550,238 | 12/1970 | Allen et al. | 29/564.1 X |
| 3,616,509 | 11/1971 | Zemek et al. | 29/564.1 |
| 3,846,907 | 11/1974 | Ivanovic | 29/741 X |

Primary Examiner—Z. R. Bilinsky
Attorney, Agent, or Firm—Wenderoth, Lind & Ponack

[57] ABSTRACT

An apparatus for inserting electric components, which have a plurality of lead wires arranged in two rows in an approximately same direction, into a circuit board, characterized in that the automatic apparatus has a taking-out chuck unit provided with a pair of forming levers for spreading the tip ends of the lead wires arranged in the two rows, a driving source for the taking-out chuck unit, an insertion chuck unit for receiving and retaining the electric components from the taking-out chuck unit to insert them into the circuit board, and a component feed portion for feeding the electric components, in a given order, to the components taking-out position for the taking-out chuck unit.

6 Claims, 23 Drawing Figures

AUTOMATIC APPARATUS FOR INSERTING ELECTRIC COMPONENTS

Figure 1A:
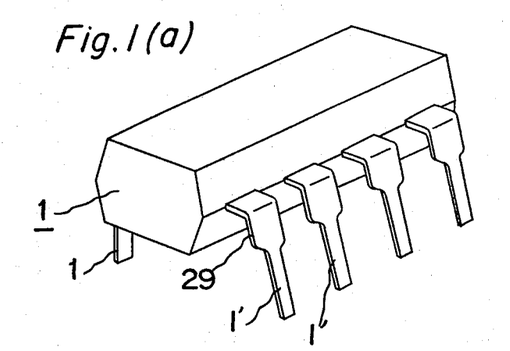
FIGS. 1(a), (b), (c) show a perspective view, a front view and a side view, respectively, of an electric component which can be inserted in the present invention.

The present invention relates to an apparatus for automatically inserting electric components, which selectively inserts into a circuit board, such components as dual in-line package type integrated circuit components as shown in FIG. 1(a), (b), (c) in given positions of the circuit board.

The integrated circuit components and similar-shape components have been manually inserted into the circuit board and, however, nowadays various automatic inserting apparatuses are being introduced. One of the conventional automatic inserting machines of this type will be described with reference to FIGS. 2 and 3, hereinafter. Referring to these drawings, a number of integrated circuit components 200 (hereinafter referred to as circuit components) as one example of electric components to be inserted are fed to a specific chute 202 by a magazine 201 as a goods-delivery box. The specific chute 202 are arranged vertically with respect to the paper of FIG. 2, and a separation block 203 is provided in the lower portion of each specific chute. A pin 204 is secured to a separation block 203, and a separation plate spring 205 is rotatably provided with the pin 204 as a supporting point. At one end of the separation plate spring 205, a component control portion 209 is formed to depress against the wall 208 of the specific chute 202 a circuit component 207b, that is, one circuit component on this side of the bottommost circuit component 207a to be dropped to a component carrying portion 206, thereby to prevent the circuit component 207b from being dropped. Also, at the other end of the separation plate spring 205, a separation drop portion 210 is formed to control the drop of the bottommost circuit component 207a of the chute. In the above described construction, a lever 211 turns in the direction of an arrow b around a supporting point 212 within the separation block 203 to cause a pin 213 secured to the lever 211 to open the component control plate 209. The circuit component 207b, one component above the circuit component 207a to be separated and dropped is grasped and secured by the component control portion 209. Thereafter, a pin 214 secured to the levers 211 turns the separation drop portion 210 in the direction of an arrow a to drop the circuit component 207a to a component carrying portion 206 thereby to provide the condition of a circuit component 207c. The lever 211 which causes one component to be separated is operated by the lever 215 of the circuit component carrying portion 206. The specific chutes 202 are vertically arranged by tens of kinds on the paper of FIG. 2 for each kind of the circuit components. When the pocket 216 of the component carrying portion 206 is located immediately under the optional one among the specific chutes 202, a spline shaft 217 turns in the direction of an arrow c. The lever 215 engages with the spline shaft and turns in the direction of an arrow c to turn, in the direction of an arrow b, the lever 211 which is provided on the specific chute 202 above the pocket 216, with the result that one circuit component is dropped to the pocket 216. The pocket 216 is located within a carrying block 218 constituting the component carrying portion 206, and the carrying block 218 is adapted to slide, by a ball screw 221, in parallel to the arranging direction of the specific chutes 202 on the slide shaft 220 extended from a body stationary block 219 and to come immediately under the specific chute 202 with the desired circuit component accommodated therein. As described hereinabove, when a desired circuit component 207c is dropped and accommodated into the pocket 216 by the operation of the lever 215, the component carrying block 218 slides on a slide shaft 220 and moves immediately above a forming transfer portion 222. Thereafter, a drop lever 223 turns in the direction of an arrow d to further drop the circuit component to the forming transfer portion 222, whereby the circuit component 207c is located in a position of 207d.

Figure 2:
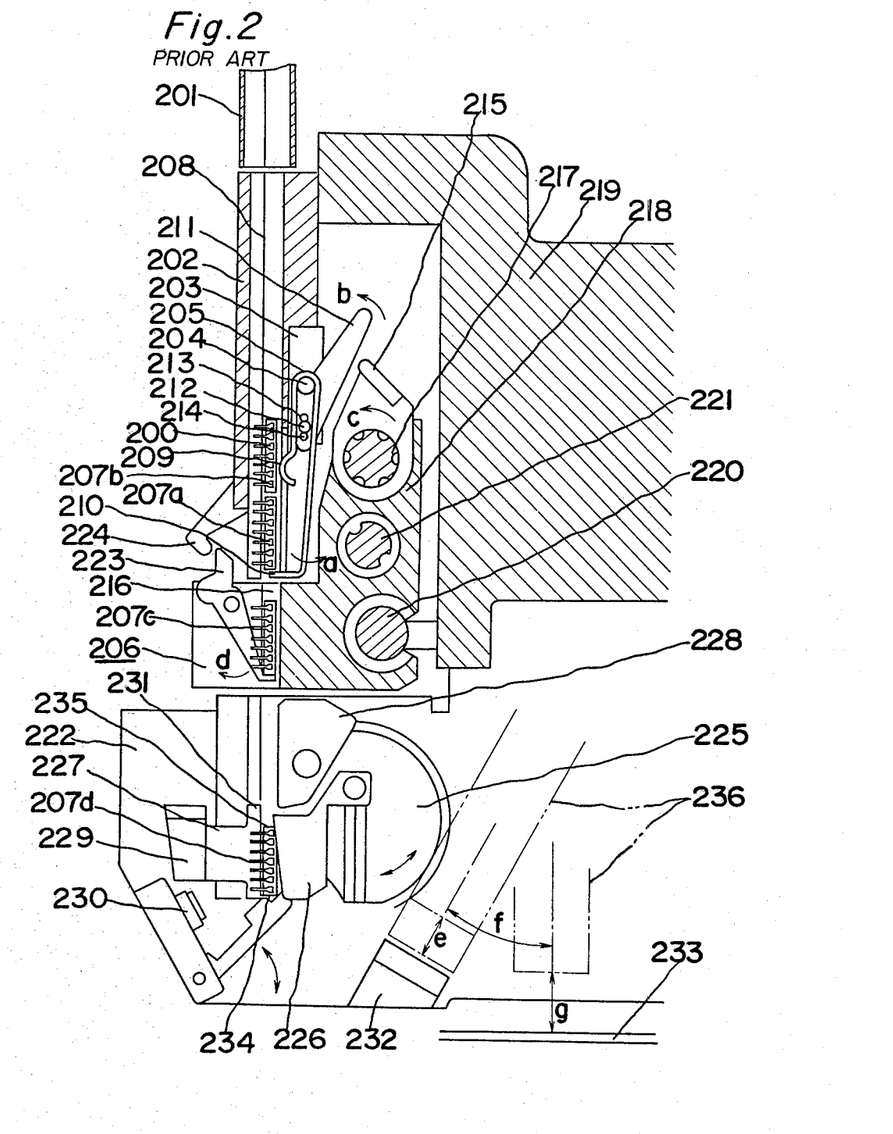
FIG. 2 and FIG. 3 show a partial cross sectional view and an essential portion side view, respectively, of the conventional representative apparatus for inserting the electric components as described above.

The drop lever 223 is turned by a switching lever 224 operated by an instruction and the positional relation is provided so that the drop lever 223 and the switching lever 224 come to a position where they can be engaged with each other when the pocket 216 has come immediately above the forming transfer portion 222.

Figure 3:
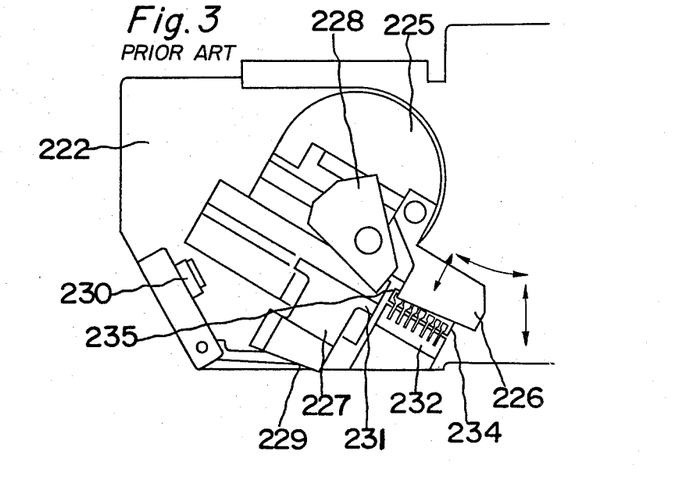

Thus, as the desired kind of circuit component is delivered to the forming transfer portion 222 to assume the shape of the circuit component 207d, a forming transfer block 225 of the forming transfer portion 222 turns by 60° as shown in FIG. 3. During this turning operation for an angle of about 60°, the circuit component 207d is spread in a direction normal to a direction along which leads are arranged.

A head control 226, a forming layer 227 and a push plate 228 are provided on the forming transfer block 225. Once the block 225 starts to turn, the circuit component 207d is retained through the rotation of the head control 226 and the push plate 228. Also, when an angle cam 229 provided at one end of the forming lever 227 passes between a pair of rollers 230 provided on the fixed side of the forming transfer side 222 as the forming transfer block 225 turns, a forming unit 231 provided on the other end of the forming lever 227 is opened to spread the lead wire of the circuit component thereby to form the lead wire. After the rotation of the head control 226 and the push plate 228 is over, the forming unit 231 is returned to its original shape with a spring (not shown). Furthermore, the head control 226 and the push plate 228 start to advance by another driving source (not shown) to move the circuit component up to a delivery base 232. The delivery base 232 is adapted to hold the circuit components by means of vacuum. Even when the head control 226 and the push plate 228 retreat to the condition of FIG. 2, the circuit component is retained on the spot without being dropped.

When the desired circuit component is set on the delivery base 232 in this manner as described hereinabove, insertion heads 236 which are engaged with the body stationary block 219 give the operations of arrows e, f, g to the circuit component to engage the circuit component with a printed circuit board 233.

Within the conventional system as described above, extremely complicated mechanism is required, such that the specific chutes 202 are provided equal in number to the number of the circuit component types and a separation portion of the separation block 203 is provided for each of the specific chutes. The carrying block 218 has to come and go each time between the specific chute 202 and the forming transfer portion 222. Accordingly, high-speed insertion is difficult and, also, reliability is unstable, because the delivery of the circuit components from the carrying block 218 to the forming transfer portion 222 depend upon gravity only. Also, the delivery of the circuit component from the forming transfer portion 222 to the delivery base 232 to the insertion heads 236 must be made. Moreover, since fixation is achieved through only the vacuum suction, the positioning operation is unstable.

In addition, speaking of the usage, the stop face of the circuit components in the specific chutes 202, the stop face of the carrying block 218, and the stop face in the forming transfer portion 222 have been used as the front face 234 of the circuit component 207d, but the delivery face to the delivery base 232 from the forming transfer portion 222 was the rear face 235 of the circuit component 207d. An insertion range for the length, i.e., distance from the front face 234 to the rear face 235 of the circuit component which could be inserted by this inserting machine was narrow, thus making it impossible to insert many types.

Also, the disadvantages of the conventional system was that complicated construction was required to carry the circuit components from the component carrying portion 206 to the insertion and to form the lead wires.

The present invention is free from the disadvantages of the conventional inserting machines. Accordingly, it is an object of the present invention is to provide a component inserting machine wherein the range of components which can be inserted is wider and the construction is simplified as compared with the conventional inserting machines for the same types of components.

It is another object of the present invention to provide an inserting machine, which has a wider range of application and can insert a plurality of size-different electric components continuously into the circuit board.

According to the present invention, there is provided an automatic apparatus for inserting electric components for inserting, onto a circuit board, electric components having a plurality of lead wires which are arranged in two rows in an approximately same direction, and characterized in that the improvement thereof comprises a taking-out chuck unit provided with a pair of forming levers for spreading the tip ends of said lead wires in two rows thereby to retain said lead wires, a driving source for moving the taking-out chuck unit from a component taking-out position, an insertion chuck unit for receiving and retaining the electric components from said taking-out chuck unit delivered by the driving source thereby to insert the electric components to said circuit board, a component feed portion for sequentially feeding said electric components to the component taking-out position of said taking-out chuck unit, and a printed circuit board moving portion for supporting the circuit board and moving the circuit board so that a given position of the circuit board may sequentially come immediately under the insertion chuck unit.

These and other objects of the present invention will become readily apparent when reference is taken to the following explanation and accompanying drawings in which:

Figure 4:
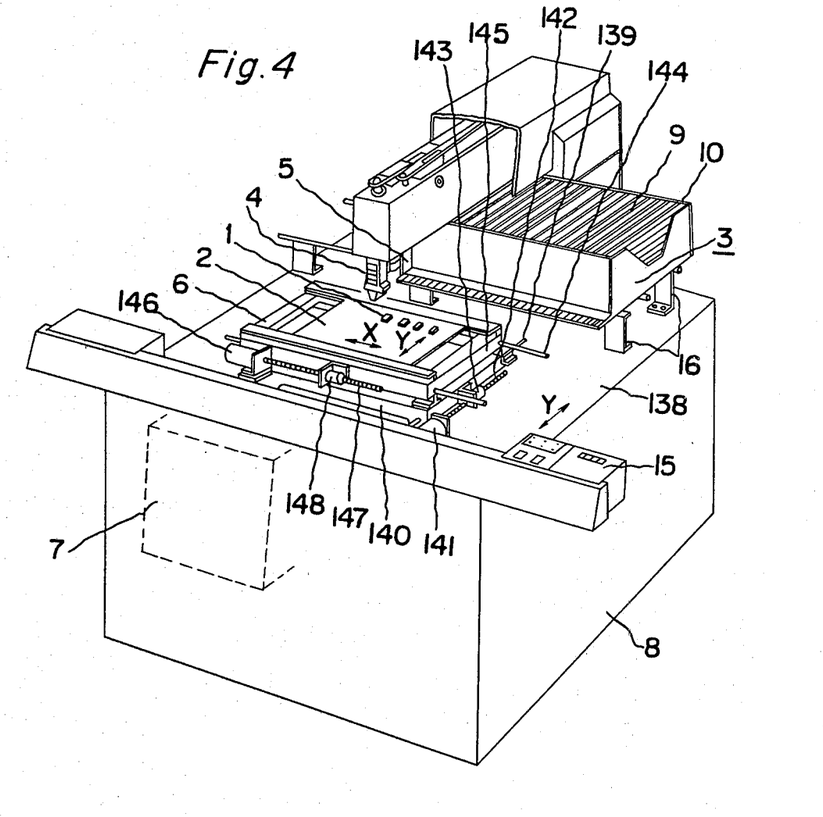
FIG. 4 is a perspective view of an apparatus for automatically inserting electric components, in one preferred embodiment, of the present invention.

An integrated circuit component 1 (hereinafter referred to as component) is one example of an electric component which is inserted into the circuit board 2 by an apparatus in the embodiment of the present invention. An apparatus for inserting the integrated circuit components in the present embodiment comprises, as shown in FIG. 4, a component feed portion 3, a forming and carrying portion 5 which takes out components 1 one by one from the component feed portion 3 to form the lead wire 1' of the component into a given shape and, thereafter, carries the component to an insertion head portion 4, the insertion head portion 4 which receives a component 1 from the forming and carrying portion 5 and inserts the component 1 into a printed circuit board 2 which is placed on a circuit board moving portion, the circuit board moving portion 6 which sequentially moves from a insertion position of the circuit board 2 to a position corresponding to the insertion head 4, a control portion 7 which controls the operation of the above portions of the apparatus, and a body 8 which supports all of the above portions of the apparatus. With the above portions, the apparatus of the present embodiment is assembled within the body and the construction of each of the above portions will be described in detail hereinafter.

First, the component feed portion 3 will be described in conjunction with FIGS. 4 and 6.

A magazine case 9 holds in a line a plurality of components 1. A batch of the magazine cases vertically piled up with the cases being guided at their both ends by a magazine stocker 10 are horizontally standing in rows, in parallel. Within such an arrangement of the cases different types of components are accommodated in the horizontal direction and the same types of components are accommodated in the vertical direction. A component guide portion 11 in FIG. 6 is provided corresponding to the bottommost magazine case 9' of the magazine stocker 10 thereby to deliver a component 1, which is pushed out from the one end of the bottommost magazine case 9', to a given position. A moving stand 12 is provided corresponding to the magazine stockers 10 and component guide portions 11 arranged in a plurality of rows and moves right and left on the horizontal plane to shift any one of the component guide portions 11 with desired components 1 contained therein to a position corresponding to the forming and carrying portion 5. A blast portion 13 normally urges the component 1 accommodated inside the bottommost magazine case 9', by compressed air, to a given position of the component guide portion 11. A discharge portion 14 in FIG. 5 retains one end of the magazine case 9 emptied to discharge the magazine case 9' from the magazine stocker 10. An operating portion 15 is provided with a control panel including operational switches and indicating lamps. Legs 16 support through rails (described later) the magazine stocker 10 on the apparatus body 8.

The magazine stocker 10 will be described hereinafter.

Figure 6:
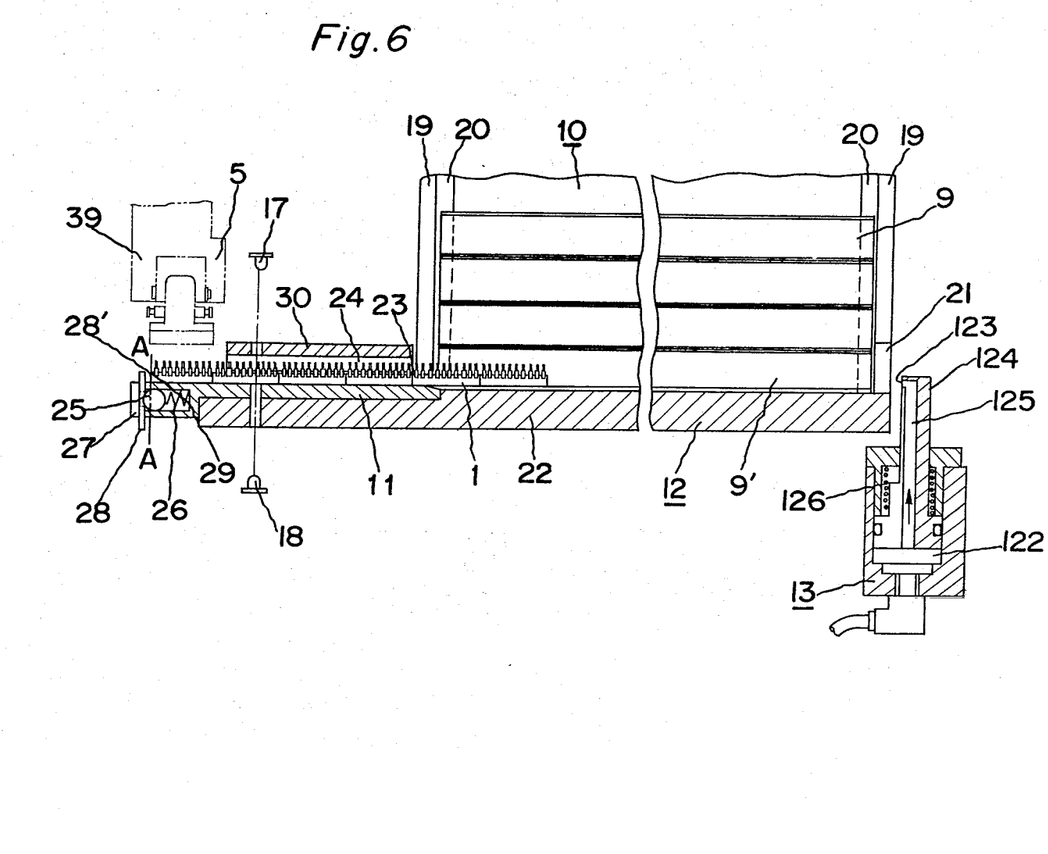
FIG. 6 is a side sectional view of a magazine stocker portion, a blast portion and a component guide portion of the apparatus of FIG. 4.

Referring to FIG. 6, a light illuminating element 17 and a light receiving element 18 are adapted to detect the existence of the component on the component guide portion 11. A guide plate 19 guides the ends of the magazine 9 opposite to a component passing opening 23 of the magazine stocker 10, while a projection 20 guides the side face of the magazine 9. A discharge opening 21 of the magazine is provided at the lowest portion of the guide plate 19. The magazine 9 is regulated to move to a position where the magazine comes into contact, on its bottom face, against the top portion of the base 22 of the moving stand 12. A plurality of magazines are vertically piled up above the bottommost magazine 9', and when the bottommost magazine 9' has been emptied, the magazine 9' is discharged by a magazine discharge portion 14 (described later) and each magazine of the magazine stocker 10 drops one stage toward the bottommost magazine 9'. The next new magazine 9 is regulated at the bottommost portion, and when the component 1 inside the bottommost magazine 9' is pushed, by the blast portion 13, into the guide groove 24 of the component guide portion 11, which is adjacent to the component passing opening 23 of the magazine stocker 10, the component is pushed as far as a position A—A where the end face 29 of a lead wire 1' at the end of a component 1 comes into contact against the end face 28' of a regulating plate 28, which is pressed, through a steel ball 25, by a spring 26 at the end of the guide groove 24 and is detachably retained between the spring and a retaining plate 27. A component control plate 30 is mounted in contact against the top of the guide groove 24.

The moving stand 12 will be described hereinafter. The above-described component guide portions 11 are mounted on the top portion of the base 22 of the moving stand 12, and magazine rows in a number corresponding to the component guide portions 11 are placed on the top portion of the base 22. Also, each of the ends of the moving stand 12 is supported on its bottom face, through a slide bearing 31, by a guide rail 32. A driving pulse motor 33 is provided to move the moving stand 12, a ball screw 34 is provided to engage with a nut 35 secured to the bottom face of the base 22 and a pulley 36 is secured to the ball screw 34, while a pulley 37 is secured to the shaft of the pulse motor 33. A timing belt 38 couples the pulleys 36 and 37. The component 1 and the component guide portion 11 which are selected by the rotational control of the pulse motor 33 are sequentially moved to a position corresponding to the forming and carrying portion 5.

A component to be inserted next is retained, by the forming and carrying portion 5 (described later) one by one from a given taking-out position, is delivered to the insertion chuck (described later) of the insertion head portion and is inserted at a given position on the circuit board.

The forming and carrying portion 5 will be described hereinafter.

Figures 7, 8:
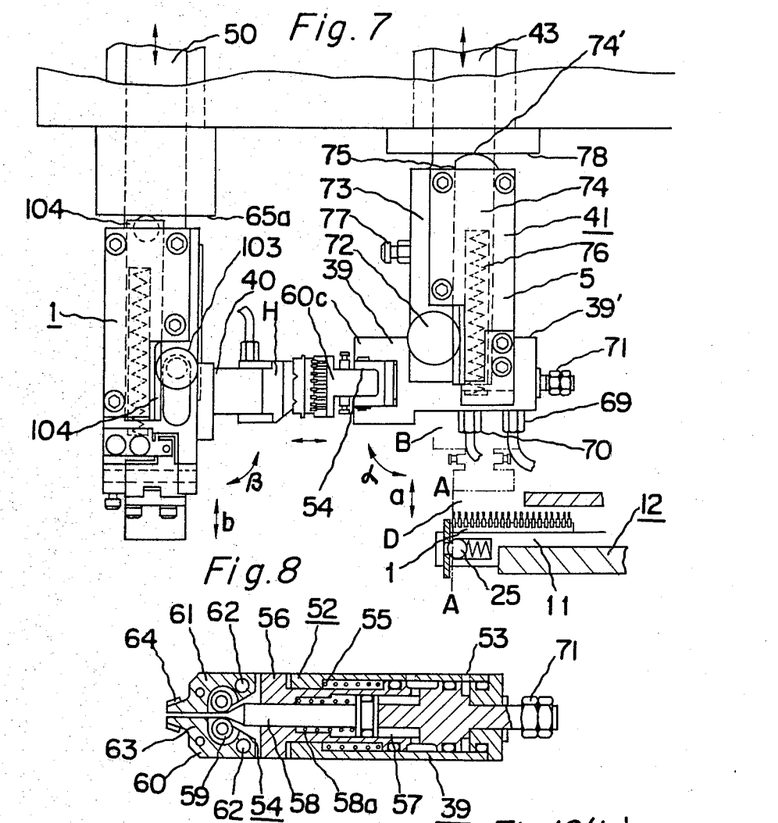
FIG. 7 is a side view of a taking-out head portion and an insertion head portion of the apparatus of FIG. 4.
FIG. 8 is a sectional plan view of a taking-out chuck unit of the apparatus of FIG. 4.

Referring to FIG. 7, a component 1 which has been fed into the component guide portion 11 and has come onto a given taking-out position A—A line is opened and retained, by a taking-out chuck unit 39, in the direction normal to a direction along which the lead wire portion 1' is arranged and in the direction the tip end is spread outside. The component 1 is raised up in the direction of an arrow a in FIG. 7 within the vertical face and is rotated inside the vertical face in the direction of an arrow a in FIG. 7. Thereafter, the component 1 is delivered to an insertion chuck unit 40 and is rotated in the direction of an arrow b inside the vertical face. Thereafter, the insertion head portion 4 itself descends downward in the direction of an arrow b and is inserted into the given position (see FIG. 5 and FIG. 7). A taking-out head portion 41 is provided with a taking-out chuck unit 39. A driving arm 42 is coupled to a taking-out shaft 43 which is provided, at its tip end, with the taking-out head portion 41. The vertical motion of the taking-out shaft 43 is performed, through a cam roller 45, by the rotation of a cam 44. A tension spring 46 is provided to raise the driving arm 42. An arm 47 is coupled to an insertion shaft (described later) which is provided, at its tip end, with the insertion head portion 4. The vertical motion of an insertion shaft 50 is performed, through a cam roller 49, by the rotation of a cam 48. A tension spring 51 is provided to raise up the arm 47.

Referring to FIG. 8, a taking-out chuck body 52, which constitutes a cylinder 53, causes an incorporated forming unit 54 to perform longitudinal motion. A return spring 55 is provided to urge the incorporated forming unit 54. A forming unit body 56, which constitutes a cylinder 57, serves as a piston sliding inside the cylinder 53. The forming unit body 56 has a piston 58 therein, which is conical at its end. The conical face of the forming unit body 56 comes into contact through a pair of rollers 59 to open and close forming levers 60, 61. The levers 60, 61 are supported, at the tip end portion of the forming unit body 56, by a pin 62 and are normally closed, at the tip ends, by a tension spring 63. A return spring 53a is provided between the piston 58 and the forming unit body 56. A V-shaped groove 64 is disposed, at the tip end portions of the levers 60, 61, at the same pitch as the lead pitch p, as shown in FIG. 1, of the component 1. When the levers 60, 61 have been opened, the V-shaped groove 64 comes into contact with the lead wire 1' of the component and furthermore, the opening p' of the lead wire 1' is opened to a given pitch 9. And the lead wire 1' is adapted to be corrected and retained so that the lead pitch p may remain as it is.

Figure 5:
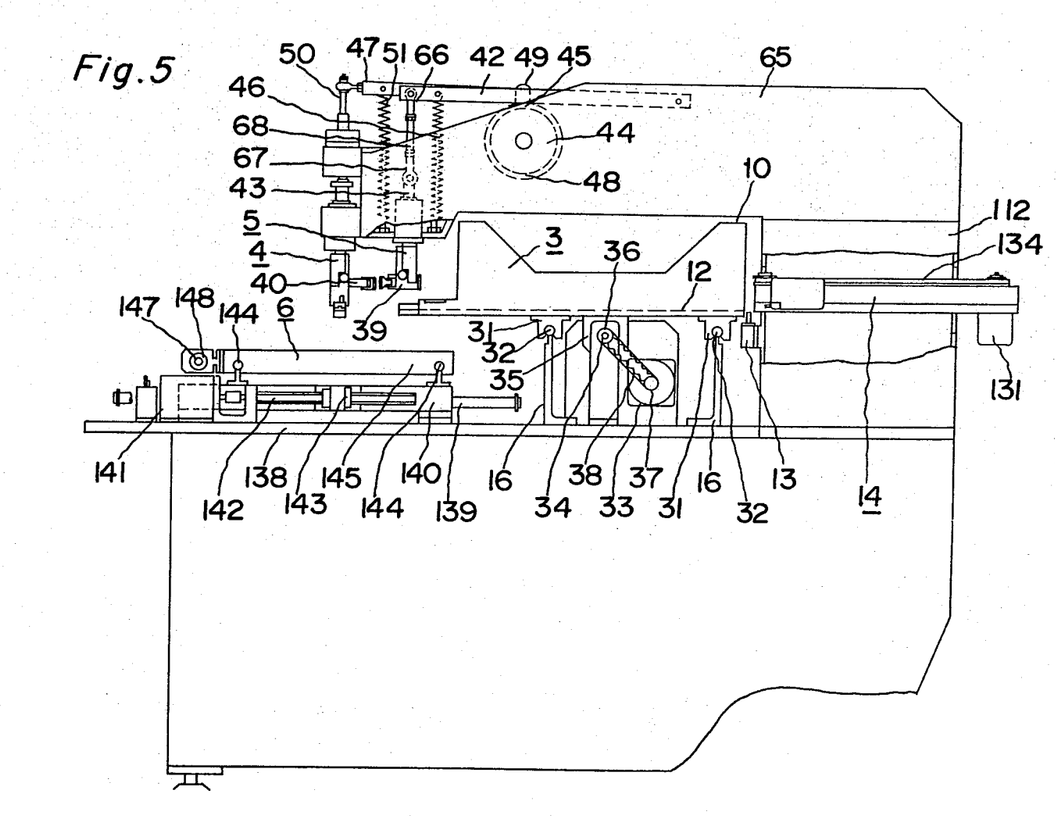
FIG. 5 is a side view of the same apparatus of FIG. 4.

Referring to FIG. 5, the taking-out shaft 43 is slidably supported in the vertical direction with respect to the insertion head portion body 65. A spherical bearing 66 is mounted to the tip end of the driving arm 42, and a spherical bearing 67 is mounted on the taking-out shaft 43. Two spherical bearings 66 and 67 are coupled, by a rod 68, with respect to each other. The taking-out shaft 53 is vertically slided through the vertical oscillating motion given to the arm 42 by the cam 44.

The tip end portion of the taking-out head portion 41 will be described hereinafter in detail.

Figure 9A:
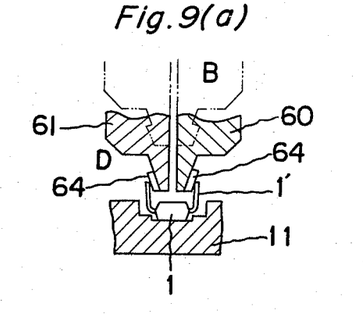
FIGS. 9(a), (b) are, respectively, front sectional views of a component guide portion and a forming portion of a taking-out chuck unit of the apparatus of FIG. 4.
Figure 9B:
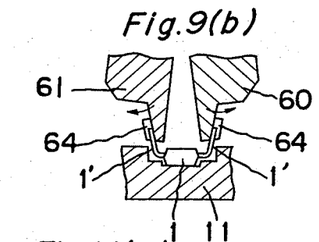
Figure 9C:
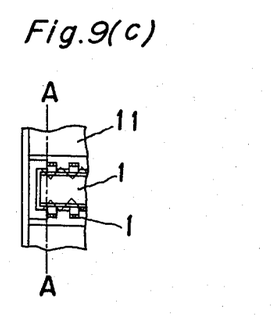
FIGS. 9(c), (d) are, respectively, a plan and a partially sectional side views of the same portions of FIGS. 9(a), (b).
Figure 9D:
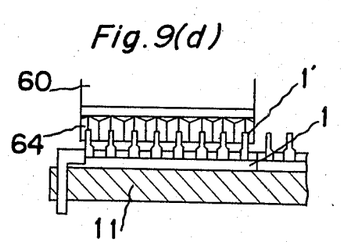
Figure 10A:
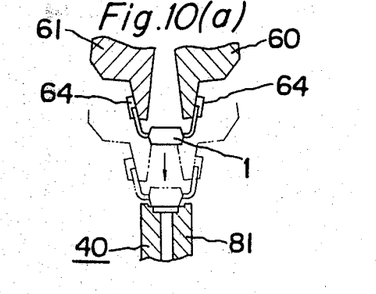
FIGS. 10(a), (b) are, respectively, sectional plan views showing a forming unit and an insertion chuck unit absorbing portion of the apparatus of FIG. 4.
Figure 10B:
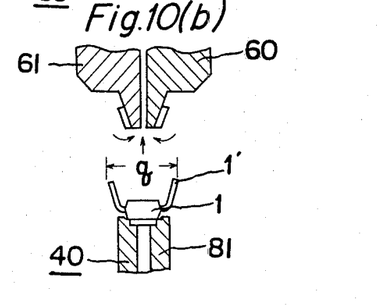

Referring to FIG. 7, air feed exhaust ports 69, 70 and a stop 71 are provided on the taking-out chuck unit 39. A pinion 72 with a shaft thereon rotates the taking-out chuck unit 39. A flange 73 which supports the shaft pinion 72 constitutes the tip end portion of the taking-out shaft 43. A slide rack 74 engages the shaft pinion 72, and a slide groove 75 which causes the slide rack 74 to slide thereinto is mounted on the flange 73. A compression coil spring 76 is engaged inside the slide rack 74 to normally raise the slide rack 74 upwardly. In the normal condition, as shown with B in FIG. 7, the pinion 72 which engages the slide rack 74 is normally subjected to a counterclockwise rotating force and stops at a position, where the motion of the component guide portion 11 is not interfered with, in the vertical condition with the rear end 39' of the chuck unit 39 being held against the stop 77. When an insertion instruction is transmitted, the taking-out shaft 43 descends to the bottom dead center, as seen in FIG. 9(a) and shown with D in FIG. 7, and the levers 60, 61 are opened to correct and retain the lead wire 1' of a component 1 at a given position of the component guide portion 11, as seen in FIG. 9(b). When the taking-out shaft 43 is raised, the chuck unit 39 rises upwards in the vertical direction until the top face 74' of the slide rack 74 comes into contact against the bottom face 78 of the insertion head portion body. As the top face 74' of the slide rack 74 comes into contact against the bottom face 78, the slide rack 74 is relatively depressed. The shaft pinion 72 which is engaged with the slide rack rotates clockwise, and the taking-out chuck unit 39 becomes horizontal, as shown with C position of FIG. 7, at a position where the taking-out shaft 43 has come to the top dead point. Under this condition, air is fed to the cylinder 53 of the chuck unit 39, whereby the forming unit 54 is advanced to deliver the component 1 to the insertion chuck unit 40 waiting at the H position of FIG. 7 and, then, the levers 60, 61 are closed and the forming unit 54 retreats as shown in FIGS. 10(a), (b). Thereafter, as the taking-out shaft 43 starts to descend, the slide rack 74 is relatively pushed up in accordance with the descending stroke, and the shaft pinion 72, which is engaged with the rack 74, is rotated counterclockwise and waits for a condition where it has descended down to a given position, as shown with B in FIG. 7.

The insertion head portion 4 will be described hereinafter in detail with reference to FIG. 11.

An insertion chuck body 79 has a coil spring 80 and a suction portion 81 therein. A mounting hole 82 for a pinion shaft (described later) and a clamp screw 83 are provided respectively on the insertion chuck body 79. A suction opening 84 is connected to a vacuum generating source. A suction face 85 is provided at the front edge of the suction opening 84. A guide shaft 86, which forms an insertion head portion, is slidably supported vertically on the insertion head portion body 65.

An insertion shaft 50 has a shaft portion slidably engaged with the inner side hole of a guide shaft 86. An adjusting nut 87 is mounted on the central screw portion of a guide shaft 86. A pair of guide stands 88 are rotatably supported by a pin 89 mounted on the lower end portion of the guide shaft 86. And the guide stands 88 are normally urged in the direction of an arrow x with the top end face 88a of the guide stand 88 being in contact with the outer face 92a of the flange 92 of the insertion shaft 50 by a torsion spring 91 mounted in the lower portion groove 90.

A stop 93 is in contact against the rear face 88b of the guide stand 88. Also, a pair of lead wire guides 94 are mounted, with a pair of screws 95, at a given lead wire guide pitch S, in the lower portion of the guide stand 88, with a pair of lead wire guides 94 corresponding, at their tip ends, to the lead wire insertion pitch of the printed circuit board. A spherical bearing 96 is mounted at the tip end of an arm 47 and a nut 97 secures the inner face 98 of the spherical bearing 96 to the insertion shaft 50, while a steel ball 99 engages the insertion shaft 50 with the guide shaft 86.

With the above construction, the vertical motion which a cam 48 gives to an arm 47 is transferred to the insertion shaft 50. As the insertion shaft 50 starts to descend from the top dead point, as shown with FIG. 11(a), the guide shaft 86 which is engaged with the steel ball 99 starts to descend at the same time. As the guide shaft 86 descends a fixed amount, the adjusting nut 87 hits against the insertion head portion body 65 to stop the descent of the guide shaft 86, as shown with FIG. 11(b). Here the steel ball 99 moves into an escape hole 100 to release the engagement between the guide shaft 86 and the insertion shaft 50, and at the same time, the guide shaft 86 engages the insertion head body 65 by the steel ball 99. Thereafter, only the insertion shaft 50 descends as far as the bottom dead point, as shown with FIG. 11(c). In the case of the ascending operation, only the insertion shaft 50 first, ascends with the guide shaft 86 being engaged with the insertion head body 65 by the steel ball 99. The steel ball 99 is pushed back into the groove portion 101 of the insertion shaft 50 from the escape hole 100 at a position where the top portion 92b of the flange 92 in the lower portion of the insertion shaft 50 comes into contact against the guide shaft 86. Also, the engagement between the guide shaft 86 and the insertion head portion 65 is released and, at the same time, the guide shaft 86 and the insertion shaft 50 are engaged with respect to each other. Thereafter, the guide shaft 86 and the insertion shaft 50 simultaneously ascend from this position to the top dead point.

The tip end portion of the insertion head 4 will be described hereinafter in more detail.

Referring to FIG. 11, a pinion shaft 102, which supports the insertion chuck unit, is secured at its one end to a pinion 103, said pinion shaft 102 being rotatably supported by the flange 92 located at the tip end of the insertion shaft 50. A slide rack 104 engages the pinion 103 and a slide groove 105 for sliding the slide rack 104 is formed at the tip end portion of the guide shaft 86. A compression coil spring 106 is engaged with the interior of the slide rack 104 to normally push the slide rack 104 upwardly.

Figure 11A:
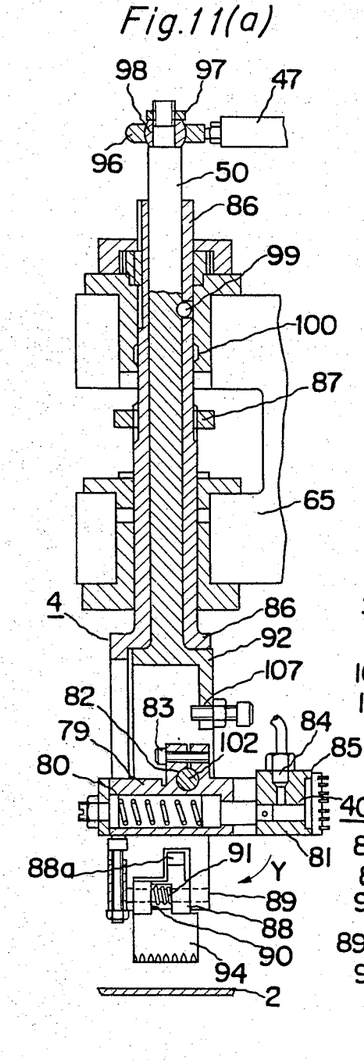
FIGS. 11(a), (b), (c) are, respectively, sectional views, in top dead center position, middle position, bottom dead center position, of an insertion head portion of the apparatus of FIG. 4.

In a condition where the inserting shaft 50 is located at the top dead point, the slide rack 104 is kept pressed against the bottom face 65a of the insertion head portion body 65. The insertion chuck unit 40 is mounted and secured, for horizontal positioning, to the pinion shaft 102 of the pinion 103 which engages the slide rack 104 as shown in FIG. 11(a). In this condition, the component 1 is delivered from the taking-out chuck unit 39 to the insertion chuck unit 40 and starts its insertion by the above-described head descending operation. As the insertion shaft 50 starts its descent, the slide rack 104 is relatively raised, since the slide rack 104 is simply pushed upwardly by a built-in compression spring 106 in accordance with the descending stroke. A pinion 103, which is in engagement with the slide rack 104, and the pinion shaft 102 rotate in the direction of an arrow Y in FIG. 11(a) and the rear end of the insertion chuck body 79 comes into contact with the stop 107. The component 1 is located above the circuit board 2 with the lead wire 1' being directed in the direction of the circuit board 2 and is prepared for insertion. On further descent, the component 1 descends with the lead wire 1' being directed at the direction of the circuit board 2. The lead wire 1' of the component 1 is guided by the lead wire guides 94, which are positioned to guide the lead wire 1', to the hole of the circuit board 2 into which the component is to be inserted and is inserted thereinto. The space P' shown in FIG. 1(b), between the lead wires 1' of the component 1 with respect to the lead wire guide pitch S under this condition is increased in advance to a pitch q by the above-described taking-out chuck unit 39.

Figure 11B:
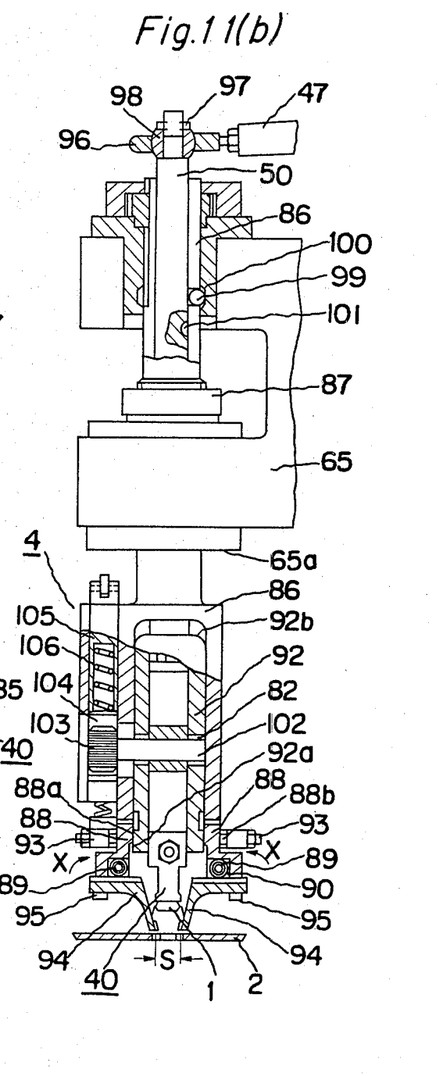
Figure 11C:
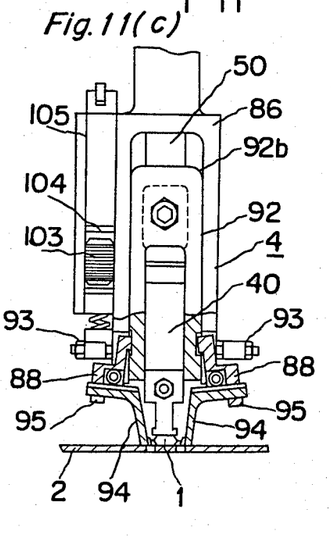

Since the lead wire spreading is carried out to establish the relationship S<q, the lead wire 1' of the component 1 is sure to go, as shown in FIGS. 11(a) to (c), along the guide 94.

Figures 12, 13A:
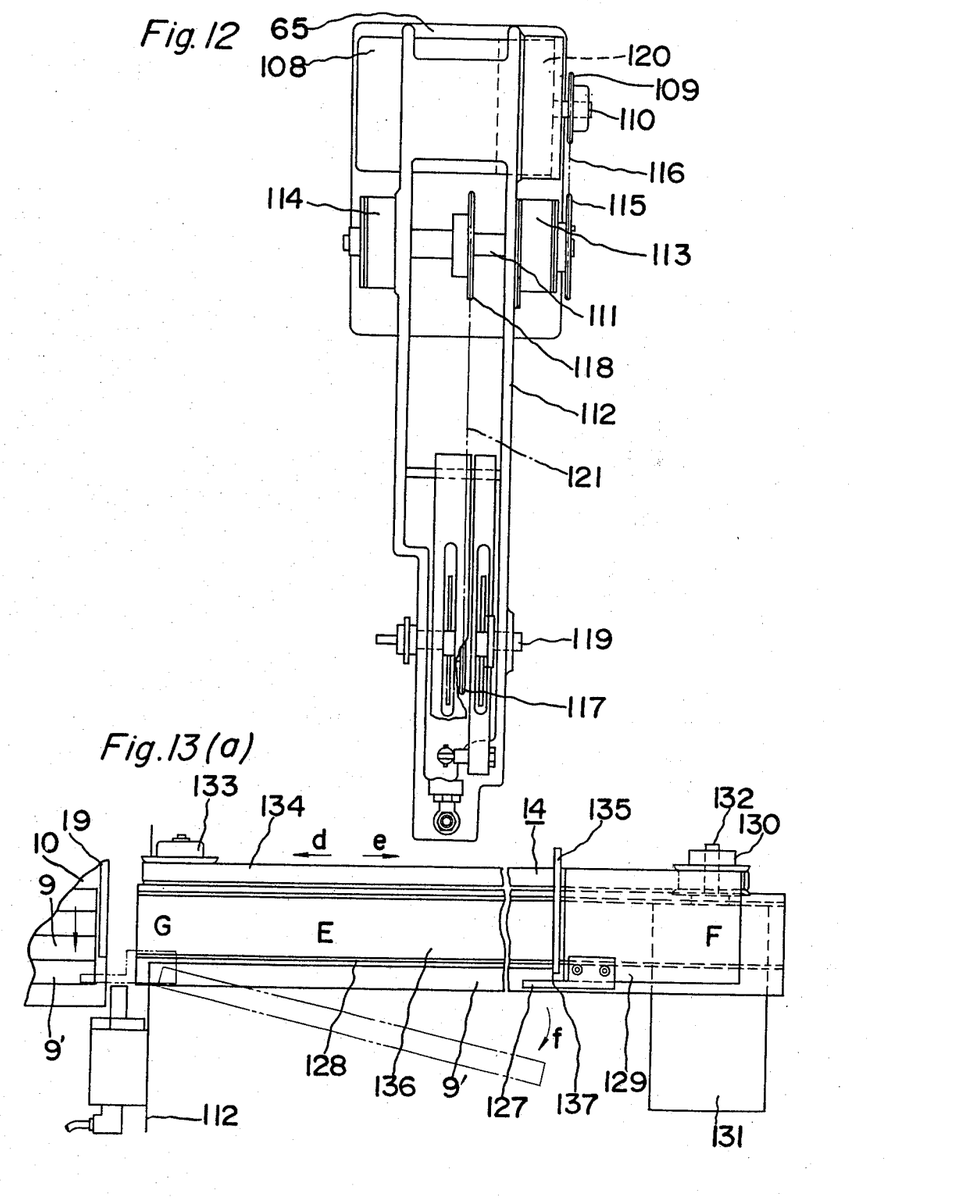
FIG. 12 is a plan view showing the driving relationship of the insertion head portion of the apparatus of FIG. 4.
FIGS. 13(a), (b) are, respectively, a side view and a front sectional view of a magazine exhaust portion of the apparatus of FIG. 4.

The driving relation of the insertion head portion 4 will be described hereinafter with reference to FIG. 12.

A motor 108 with a speed reducing machine is mounted on the insertion head portion body 65. A sprocket 109 is mounted on the output shaft 110 of the speed reducing machine motor 108. A transfer shaft 111 which is supported by a head frame 112 is provided, at its ends, with a clutch 113 and a brake 114. A sprocket 115 which is mounted on the clutch 113 is coupled to the speed reducing machine motor by a chain 116.

Sprockets 117 and 118 are mounted, respectively, on a cam shaft 119 and the transfer shaft 111 and the two shafts 119 and 111 are coupled to each other by a chain 121. A speed reducing machine portion 120 of the speed reducing machine motor 108 is provided within the insertion head portion body 65. The rotation of the speed reducing machine motor 108 is transmitted to the cam shaft 119 through the above-described construction and the inserting operation such as the operation of the taking-out shaft 43, the operation of the insertion shaft 50 or the like is effected through the rotation of the cam shaft 119.

The blast portion 13 will be described hereinafter. The blast portion 13 is provided at a position opposite to the forming and carrying portion 5 with the magazine stocker 10 grasped therebetween. Referring to FIG. 6, a cylinder 122 has a piston 124 therein, the piston being provided, at its tip end, with a nozzle 123. An air flow passage 125 is provided in the piston 124 and a piston return spring is provided to urge the piston downwards. The piston 124 normally waits for at the bottommost stage and rises when the air is fed, and the air flows to the flow passage 125 and is blown in the horizontal direction from the nozzle 123 in the tip end portion of the piston 124, whereby the component is pushed out until the component 1 inside the bottommost magazine 9' comes into contact with the regulating plate 28 of the component guide portion 11.

The magazine discharge portion 14 will be described hereinafter.

Referring to FIG. 13, a projection 127 is pressed into one end of the magazine 9' and is mounted on a block 129 slidably supported horizontally on a slide rail 128. A driving pulley 130 is mounted on the shaft 132 of the driving motor 131 and a belt 134 is entrained between the driving pulley 130 and an inverted pulley 133. The slide block 129 is mounted on this belt 134 and a magazine stop 135 is provided on the magazine discharge portion 14. A mounting plate 136, which carries the slide rail 128 and the driving motor 131, is mounted on a head frame 112.

Figure 13B:
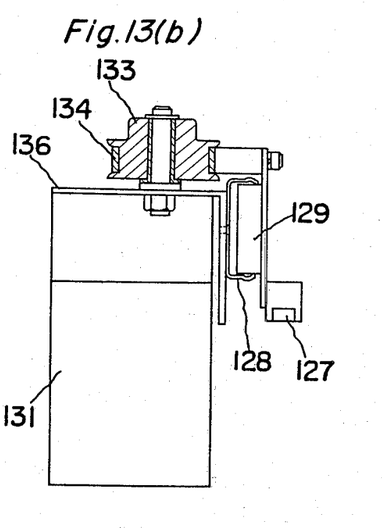

The block 129 normally stops at the position E in FIG. 13(b). As all the components inside the bottommost magazine 9' are removed, the belt 134 is driven in the direction of an arrow d and the projection 127 is pressed at the G position into the inner wall of the magazine 9'. Thereafter, the belt 134 is driven in the direction of an arrow e and the slide block 129, also, moves in the direction of an arrow e through the belt 134, whereby the magazine 9' retained by the projection 127, also, moves in the direction of an arrow e. In addition, as the slide block 129 moves in the direction of the arrow e, the end face 137 of the magazine 9' comes into contact with the stop 135. Only the block 129 and the projection 127 move to the F position and the retention by the projection 127 is released to drop the magazine 9' in the direction of an arrow f. Also, when the magazine 9' is disengaged from the rear guide plate 19 of the magazine stocker 10, all the magazines 9 loaded on the top of the magazine 9' drop, by one stage, due to the weight of the magazines to feed a new magazine 9' to the bottommost portion. Thereafter, the slide block 129 returns to the E position and waits. Accordingly, the automatic exchange of the magazines 9 is made by the above-described actions in one cycle.

The printed circuit moving portion 6 will be described hereinafter. A base 138 is located on the apparatus body 8 with the board moving portion 6 thereon. A Y-direction slide shaft 139 in the drawing is secured to the base 138 and a Y table 140 slides on the slide shaft 139. A pulse motor 141 is mounted on the base 138. A pair of ball screw 142 and ball nut 143 are provided to drive the Y table, and the ball screw 142 is directly coupled to the pulse motor 141, while the ball nut 143 is secured to the Y table 140. Similarly, an X-direction slide shaft 44 is secured to the Y table 140 and a X table 145 slides on the slide shaft 144. A pulse motor 146 is mounted on the Y table 140. A ball screw 147 and ball nut 148 are provided for driving the X table and the ball screw 147 is directly coupled to the pulse motor 146, while the ball nut 148 is secured to the X table 145.

The construction and operation of the major portions constituting the present apparatus have been described. Finally, the correlated operations of the major portions will be described in accordance with the timing diagram of FIG. 14.

Figure 14:
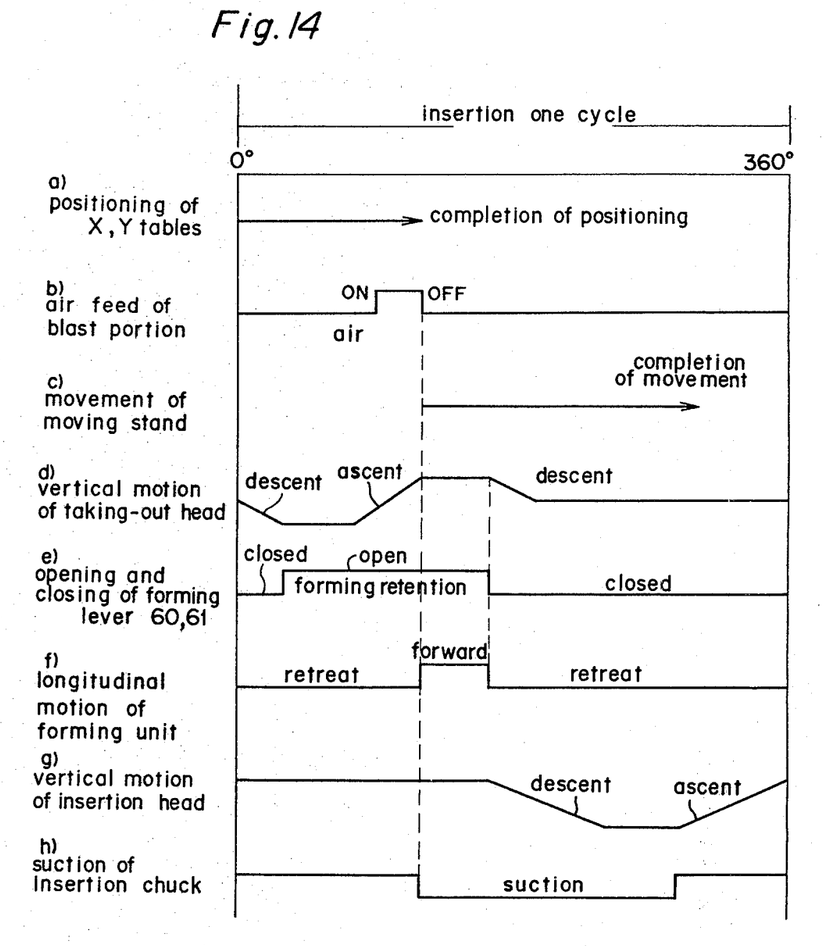
FIG. 14 is a timing diagram relating to the apparatus of FIG. 4.

This timing diagram shows one cycle of the insertion of the component 1.

First, in the start position, i.e., position of 0° in the diagram, each of the tables X, Y stops at a predetermined position. Also, a component 1 to be inserted is prepared on a given taking-out position A—A line of the component feed portion 10. In addition, the taking-out chuck unit 39 and the insertion chuck unit 40 assume the standing-by postures, respectively, in the B and H positions shown in FIG. 7. Each of the X and Y tables starts to locate the circuit boards 2 so that the hole of the circuit board 2 into which the component 1 is to be inserted will come immediately below the insertion head portion 4. Also, the taking-out chuck unit 39 moves to the D position to open the forming levers 60, 61 to form and retain the lead wire 1' of the component 1 and to carry it to the C position. Then, the component 1 is taken out from the component feed portion 10 and the taking-out chuck unit 39 moves to the C position and, thereafter, air is fed into the bottommost portion magazine 9' from the blast portion 13 to send the next component 1 so that the component will be normally kept on the A—A line. Also, after the component 1 has been delivered to the component guide portion 11, the moving stand 12 starts its motion to prepare the next component to be inserted. At the C position, the forming unit 54 of the taking-out chuck unit 39 advances to start to absorb the insertion chuck unit 40. Then, the levers 60, 61 of the taking-out chuck unit 39 close and the forming unit 54 retreats to deliver the component 1. Since the positioning operation of each of X, Y tables 145, 140 has been completed during this period, the insertion shaft 50 starts its descent to perform the inserting operation. On the other hand, the taking-out chuck unit 39 is restored to its B position to assume the standing-by position until the next inserting operation starts.

As the inserting shaft 50 descends, the component 1 is inserted into a hole corresponding to the circuit board 2 by the above-described inserting operation.

As is apparent from the above description of the embodiment, according to the apparatus for automatically inserting the electric components of the present invention, desired types of electric components are adapted to be sequentially delivered, by the component feed portion, to the taking-out position of the taking-out chuck unit. Thus, different types of electric components can be continuously mounted, in a desired order, on the circuit board. In addition, since the taking-out chuck unit spreads, with forming levers, the tip ends of a plurality of lead wires arranged in two rows along the electric components to prepare the lead wires for insertion, the taking-out operation of the electric component and the carrying operation thereof to the insertion chuck unit can be performed without fail, and the inserting operation of the lead wires into the circuit board can be made easily and accurately. Furthermore, the electric components, if different in size, can be mounted on the circuit board.

Also, since the forming lever of the taking-out chuck unit is provided with grooves to guide and correct the position of each of the guide wires, the pitch between the adjacent lead wires if the tip ends of the lead wires arranged in two rows are spread remains unchanged, thus resulting in the reliable insertion of the lead wires into the circuit board.

In addition, the component feed portion is provided with a blast portion to deliver the electric components located within the magazine to the electric component taking-out position through the air pressure, thus making it possible to deliver the electric components from inside the magazine with a simple construction and allows the emptied magazine to be easily taken out.

Furthermore, since the emptied magazine is automatically discharged by the magazine discharging portion and the new magazine is fed to a given position, the magazine exchanging time is reduced, and many electric components can be continuously mounted on the circuit board in a shorter period of time than heretofore, whereby the operation can be extremely efficiently performed.

It will be obvious to those of ordinary skill in the art that many changes can be made in the apparatus without departing from the scope of the appended claims.

What is claimed is:

1. In an automatic apparatus for inserting electric components into a circuit board, the electric components having a plurality of lead wires which are arranged in two rows in approximately the same direction, the improvement comprising a taking-out chuck unit provided with a pair of forming levers for spreading apart the tip ends of said lead wires in two rows and retaining said lead wires, a driving source for moving the taking-out chuck unit from a component taking-out position, an insertion chuck unit for receiving and retaining the electric components from said taking-out chuck unit delivered by the driving source thereby to insert the electric components into said circuit board, and a component feed portion for sequentially feeding said electric components to the components taking-out position of said taking-out chuck unit.

2. An automatic apparatus for inserting electric components in accordance with claim 1, wherein a plurality of grooves for correcting the space between the lead wires of each row in the two rows of lead wires of a component are formed in the forming levers of said taking-out chuck unit.

3. An automatic apparatus for inserting electric components in accordance with claim 1, wherein said component feed portion is provided with a blast portion which sends the electric components located within the magazine case, by an air current, in the direction of the taking-out chuck unit at a position corresponding to the position of the taking-out chuck unit, a plurality of magazine cases each having electric components being horizontally arranged in parallel on the moving stand to be driven in the horizontal direction.

4. An automatic apparatus for inserting electric components in accordance with claim 3, wherein said component feed portion is provided with a magazine discharge portion for discharging the bottommost magazine case, each of the magazines being horizontally disposed, magazine cases with the same types of electric components therein being piled up and retained in each of the magazines.

5. In an automatic apparatus for inserting electric components into a circuit board, the electric components having a plurality of lead wires which are arranged in two rows in approximately the same direction, the improvement thereof comprising a taking-out chuck unit provided with a pair of forming levers for spreading the tip ends of said lead wires in two rows and retaining said lead wires, a driving source for moving the taking-out chuck unit from a component taking-out position, an insertion chuck unit for receiving and retaining the electric components from said taking-out chuck unit delivered by the driving source thereby to insert the electric components into said circuit board, a component feed portion for sequentially feeding said electric components to the component taking-out position of said taking-out chuck unit, and a printed circuit board moving portion for supporting the circuit board and moving the circuit board so that [a] given positions of the circuit board may sequentially come immediately under the insertion chuck unit.

6. An automatic apparatus for inserting electric components in accordance with claim 5, wherein a plurality of grooves for correcting the space between the lead wires of each row in the two rows of lead wires of a component are formed in the forming levers of the taking-out chuck unit.

* * * * *